United States Patent [19]
Schild

[11] Patent Number: 6,145,520
[45] Date of Patent: Nov. 14, 2000

[54] APPARATUS FOR PROCESSING SUBSTRATES IN A FLUID TANK

[75] Inventor: Robin Schild, Reutlingen, Germany

[73] Assignee: Steag Microtech GmbH, Germany

[21] Appl. No.: 09/171,757

[22] PCT Filed: Apr. 12, 1997

[86] PCT No.: PCT/EP97/01838

§ 371 Date: Oct. 21, 1998

§ 102(e) Date: Oct. 21, 1998

[87] PCT Pub. No.: WO97/39840

PCT Pub. Date: Oct. 30, 1997

[30] Foreign Application Priority Data

Apr. 24, 1996 [DE] Germany .................. 196 16 400

[51] Int. Cl.[7] ..................................................... B08B 3/04
[52] U.S. Cl. .................. 134/95.2; 134/183; 134/902
[58] Field of Search ..................... 134/902, 61, 95.2, 134/183, 186

[56] References Cited

U.S. PATENT DOCUMENTS

| 2,713,347 | 7/1955 | Hazy ............................ 134/186 X |
| 5,921,257 | 7/1999 | Weber et al. ..................... 134/186 |

FOREIGN PATENT DOCUMENTS 279640  12/1987  Japan ................................ 134/902

*Primary Examiner*—Philip R. Coe
*Attorney, Agent, or Firm*—Robert W. Becker & Associates

[57] ABSTRACT

An apparatus for the processing of substrates in a fluid tank is provided. The fluid tank has at least one fluid inlet opening and at least one overflow opening in the upper region of at least one side wall of the fluid tank. Optimum adaptation to fluid circulation rates is provided by at least one slide having a variable position relative to the overflow opening for varying the opening area thereof. This opening area is smaller during introduction of gas than during a preceding rinsing process.

7 Claims, 2 Drawing Sheets

APPARATUS FOR PROCESSING SUBSTRATES IN A FLUID TANK

BACKGROUND OF THE INVENTION

The present invention relates to an apparatus for processing substrates in a fluid tank, with at least one fluid inlet opening and at least one overflow opening in the upper region of at least one side wall of the fluid tank, wherein the opening area of the overflow opening is changeable.

An apparatus of this type is known from printed documents U.S. Pat. No. 5,275,184, U.S. Pat. No. 5,282,923, JP 3-233930 A2, U.S. Pat. No. 5,381,808, JP 5-94978 A2, JP 5-36666 A2, JP 6-53205 A2, JP 3-20031 or DE-A-44 13 077 filed by the instant applicant. The fluid that is introduced via the fluid inlet openings flows over the upper edge of at least one side wall of the fluid tank. These known apparatus do not make it possible to vary the fluid discharge as a function of existing conditions or of the type of fluid used, i.e. liquids or gases.

From U.S. Pat. No. 5,071,488 an apparatus of the aforementioned type is known in which the side wall of the fluid tank has an overflow edge and a knife edge arranged opposite the overflow edge so that a capillary action results in the gap between the overflow edge and the knife edge that causes removal of fluid form the fluid container. The width of this gap can be adjusted by adjusting a bolt.

It is an object of the present invention to provide an apparatus of the aforementioned type with which a gas provided for performing the drying process is used as efficiently and economically as possible during the drying process.

SUMMARY OF THE INVENTION

The stated objective is inventively solved by providing during a drying process a hood for introducing a gas above the fluid tank and by making the surface area of the overflow opening smaller for introducing a gas than during a preceding rinsing step.

Gases in this context are also gas mixtures, vapors, and vapor mixtures such as, for example, isopropyl alcohol, nitrogen or a gas mixture with the components isopropyl alcohol and/or nitrogen.

The inventive apparatus is particularly advantageous for the use of additionally introduced gases, gas mixtures, or vapors that are introduced via a hood, for example for a drying process pursuant to the Marangoni principle. To avoid repetition with respect to these processes, reference is made to DE-A-44 13 077 as well as to DE-A-195 46 990, DE-A-196 15 108 and DE-A-196 15 969 (filed on Apr. 22, 1996), the latter three applications having been filed by the instant applicant. The content of these documents is hereby incorporated into the present application by reference. During the rinsing process that precedes the drying process, large rinsing fluid quantities are changed over, so that during the rinsing process a large overflow opening area is required. During the subsequent drying process, no or only a small quantity of rinsing fluid is introduced into the fluid tank, so that large overflow opening areas are not required. The gas or vapor mixture, for example isopropyl alcohol or a mixture with isopropyl alcohol, which is required for the drying process pursuant to the Marangoni principle and is introduced via the hood, is discharged via the overflow openings.

In order to lose as little gas or vapor as possible, which is expensive or difficult to recycle, it is therefore advantageous to have during the drying process, when the substrates are lifted from the rinsing fluid, overflow opening areas that are as small as possible or even closed. The inventive apparatus now enables an optimum adaptation of the overflow opening areas to the opposite requirements during processing.

With the inventive features, it is also possible to vary the flow conditions, the flow rate, the quantity of flow, the direction of flow in the fluid tank, and/or the flow velocity of the exiting fluid as a function of the respective conditions, and, in particular, to also establish or test in the fluid tank the optimal flow conditions for a particular process. It is also possible with the inventive apparatus to vary the discharge quantity as a function of the type of fluid. For example, with a rapid circulation of the fluid that is present in the fluid tank a large overflow opening area is required, whereas with a small flow quantity smaller opening areas are more advantageous.

According to the present invention, it is also possible to vary not only the area of the overflow opening with respect to size, but also with respect to its shape. In this way, the overflow edges or shapes can be respectively optimally adjusted in order to obtain optimum flow characteristics for the respective process stage. When a plurality of overflow openings are provided, it is possible with the inventive apparatus to entirely or partially close to a greater or lesser degree, as desired, individual overflow openings or overflow openings in one side wall of the fluid tank relative to other overflow openings.

Pursuant to one advantageous embodiment of the invention, the height of the overflow opening can be varied. This is preferably realized with the aid of at least one slide means whose position in or above the overflow openings can be varied. The position of the slide relative to the overflow openings is therefore variable from above, from below, or from the side.

Pursuant to a further advantageous embodiment of the invention, the slide is a movable bar that extends over the entire width of a side wall of the fluid tank in which the overflow openings are disposed. This specific embodiment enables a simple opening and closing mechanism, since the position of only one bar has to be varied in order to alter the overflow opening areas. In so doing, the bar entirely or partially covers the overflow openings in a controllable manner.

The slide can be moved manually, or also by means of a drive mechanism, such as a stepping motor.

Pursuant to a further advantageous embodiment of the invention, at least two overflow openings are disposed one above the other, i.e. at different heights, in at least one side wall. Depending on the rate of fluid flow or fluid quantity, the fluid tank thereby overflows only at the lower overflow openings at a low flow rate, or through the lower as well as the upper overflow openings at higher rates of flow. By means of an additionally provided slide, it is possible to entirely or partially close the upper and/or lower overflow openings.

In order to achieve a uniform flow condition during overflow with overflow openings that are disposed above one another, these overflow openings are preferably laterally offset relative to one another.

The invention will be explained subsequently with the aid of exemplary embodiments in conjunction with the Figures. It is shown in:

DESCRIPTION OF PREFERRED EMBODIMENT

Figure 1:
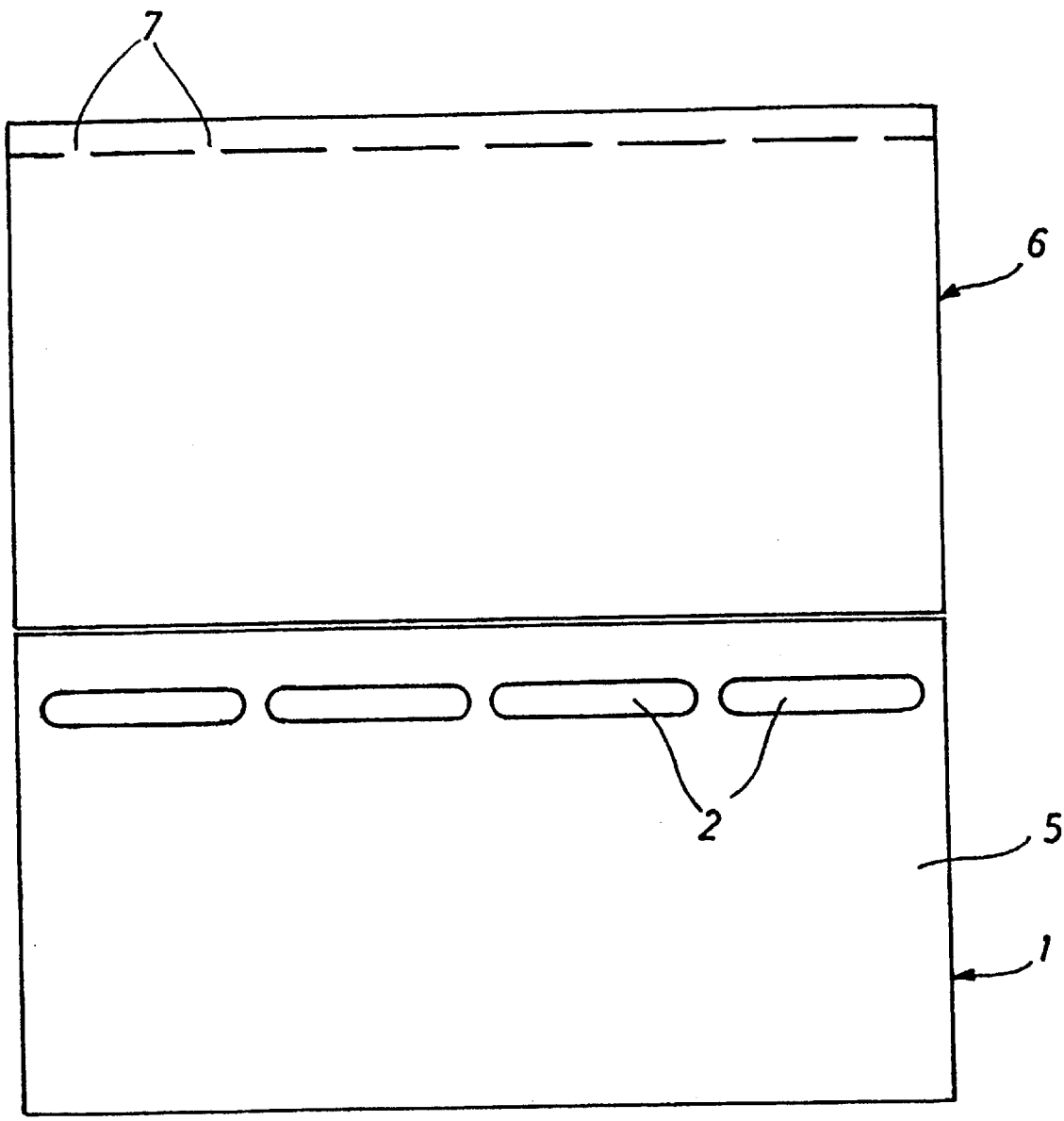
FIG. 1 a schematic view of a conventional apparatus for treatment of substrates in a fluid tank, including a hood above the fluid tank for introducing a fluid for improving the drying process, FIG. 2 a schematic representation of one exemplary embodiment of the invention where the overflow openings are open, i.e., have the greatest possible overflow opening area, FIG. 3 the apparatus illustrated in FIG. 1 with the overflow openings partially closed, and FIG. 4 an embodiment of the invention with overflow openings disposed above one another.

FIG. 1 shows in a schematic representation a conventional apparatus for treatment of substrates in a fluid tank 5, illustrating a view onto a side wall 1 provided with overflow openings 2. Above the fluid tank 5 a hood 6 is provided which is arranged during the treatment process and especially during the drying process above the fluid tank 5. A fluid for a faster and improved drying of substrates, for example according to the Marangoni principle, is introduced though respective inlet openings 7 at the upper end of the hood 6. Such arrangements are, for example, known from the aforementioned DE-A 44 13 077 so that, in order to avoid repetition, reference is made to this document; the disclosure of this document is included by reference into the instant application.

Figure 2:
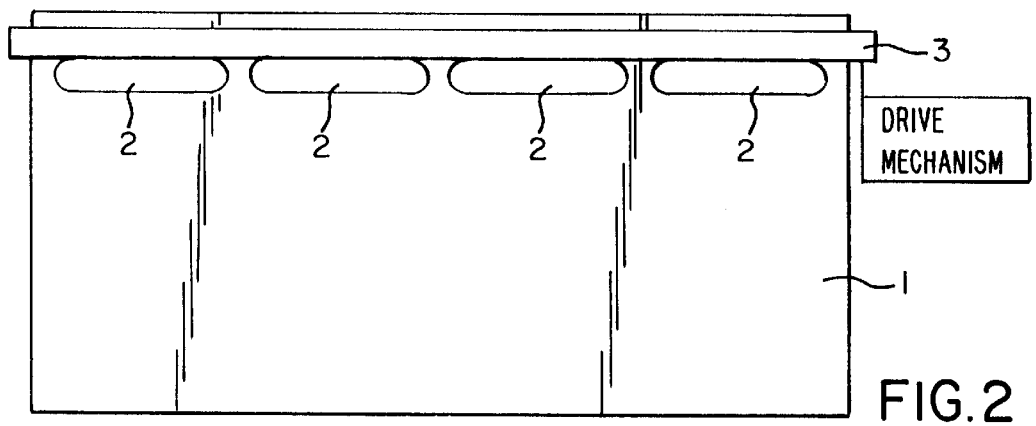

FIG. 2 shows the side wall 1 of the fluid tank 5 in which at the upper end overflow openings 2 in the form of slots are provided. Disposed above the overflow openings 2 is a slide means or bar 3 that does not cover the openings and that extends over the entire width of the side wall. In the position of the slide 3 illustrated in FIG. 2, the overflow openings are completely open, so that the greatest possible flow, for example at high fluid circulation quantities, can occur during the rinsing process of wafers received in the fluid tank.

Figure 3:
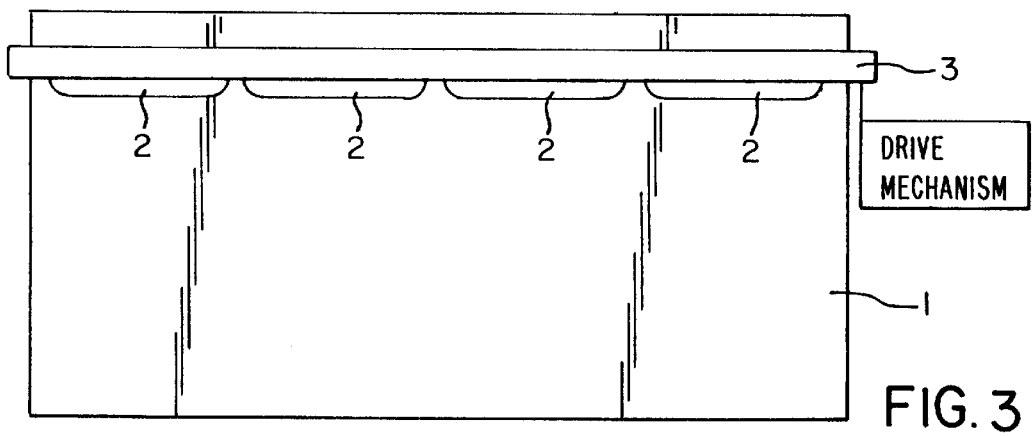

The illustration shown in FIG. 3 differs from that of FIG. 2 merely in that the slide or bar 3 has been shifted somewhat further downwardly, so that the overflow openings 2 are partially covered. In this way, the overflow opening area is reduced and is adapted to a smaller circulation volume. Thus, with the inventive apparatus the overflow opening area can be adapted to the respective flow quantity per unit of time. The inventive apparatus is particularly advantageously usable when in addition a further fluid is introduced into the fluid tank or into a hood disposed above the fluid tank. This fluid can be, for example, a gas or vapor, or a gas mixture or vapor mixture, that is introduced for a rapid and good drying of the wafers. Since during the drying process little or no rinsing fluid is circulated, the overflow opening area can be small in comparison to the preceding rinsing process with its great fluid circulation quantities.

During the drying process, a small overflow opening area is very advantageous in order to prevent the additional fluid, especially gases or vapors, introduced for the drying process from escaping at all or only in small amounts from the fluid tank or from the hood disposed over the fluid tank.

Figure 4:
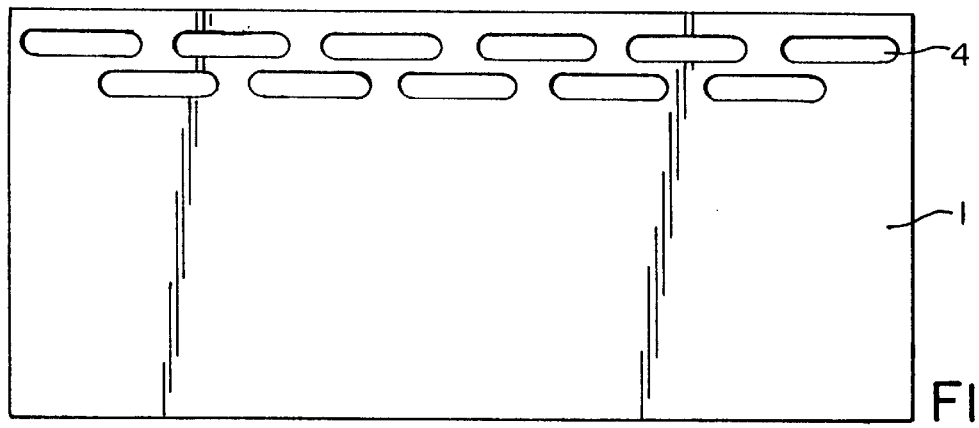

FIG. 4 shows an embodiment where in the upper region of the side wall 1 of the fluid tank overflow openings 4 in the form of overflow slots are provided above one another, in other words, at different heights. Depending upon the fluid quantities that are to be changed over, the fluid located in the fluid tank thereby flows over only at the lowermost slot at a low flow rate, or not only at the lowermost but also at the uppermost slot at high rates of flow. Although not illustrated in FIG. 4, it is also possible with this embodiment to provide a slide means or bar that can entirely or partially close off the overflow openings arranged above one another in order to thereby vary the overflow area and to optimally adapt it to respective conditions.

The invention has been described with the aid of preferred specific embodiments. However, to one having ordinary skill in the art embodiments and modifications are possible without thereby deviating from the inventive concept. For example, it is possible to provide a slide that can be controllably moved from below or above into the overflow openings to vary not only the overflow opening area but also the shape of the openings in order to optimize the flow and overflow characteristics. Appropriate devices, such as stepping motors, levers, or the like, can be utilized in order to displace the slide or a bar. The specification incorporates by reference the disclosure of German priority document 196 16 400.1 and PCT document PCT/EP97/01838 of Apr. 24, 1996 and Apr. 12, 1997, respectively.

The present invention is, of course, in no way restricted to the specific disclosure of the specification and drawings, but also encompasses any modifications within the scope of the appended claims.

What is claimed is:

1. An apparatus for processing substrates in a fluid tank having at least one fluid inlet opening and at least one overflow opening in an upper region of at least one side wall of said fluid tank, said apparatus comprising:

a hood that during a drying process is disposed above said fluid tank for the introduction of a gas; and at least one slide means having a variable position relative to said at least one overflow opening for varying an opening area of said at least one overflow opening, wherein said opening area is smaller during introduction of gas than during a preceding rinsing process.

2. An apparatus according to claim 1, wherein said at least one slide means is adapted to vary a height and/or a width of said at least one overflow opening.

3. An apparatus according to claim 1, wherein said at least one slide means is a movable bar that extends over the entire width of a side wall that is provided with said at least one overflow opening.

4. An apparatus according to claim 3, wherein said bar at least partially covers said at least one overflow opening in a controllable manner.

5. An apparatus according to claim 1, wherein said at least one slide means is connected to a drive mechanism.

6. An apparatus according to claim 1, wherein at least two overflow openings are disposed one above the other in at least one side wall of said fluid tank.

7. An apparatus according to claim 6, wherein said overflow openings that are disposed above one another are laterally offset relative to one another.

* * * * *